(12) United States Patent
Lee et al.

(10) Patent No.: US 6,747,908 B2
(45) Date of Patent: Jun. 8, 2004

(54) SEMICONDUCTOR MEMORY DEVICE AND METHOD OF SELECTING WORD LINE THEREOF

(75) Inventors: Chan-Yong Lee, Gyeonggi-do (KR); Jung-Bae Lee, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/172,314

(22) Filed: Jun. 13, 2002

(65) Prior Publication Data

US 2002/0191473 A1 Dec. 19, 2002

(30) Foreign Application Priority Data

Jun. 19, 2001 (KR) ........................................ 2001-34806

(51) Int. Cl.$^7$ ................................................ G11C 8/00
(52) U.S. Cl. ........................... 365/230.03; 365/230.04; 365/230.06; 365/230.08; 365/185.05; 365/185.23
(58) Field of Search ....................... 365/230.03, 230.04, 365/230.06, 230.08, 185.05, 185.23

(56) References Cited

U.S. PATENT DOCUMENTS

| | | | |
|---|---|---|---|
| 6,108,243 A | | 8/2000 | Suzuki et al. |
| 6,215,692 B1 | * | 4/2001 | Kang ........................ 365/145 |
| 6,400,639 B1 | * | 6/2002 | Ji et al. .................. 365/230.06 |

* cited by examiner

*Primary Examiner*—Connie C. Yoha
(74) *Attorney, Agent, or Firm*—Marger Johnson & McCollom, P.C.

(57) ABSTRACT

A semiconductor memory device includes a plurality of memory cell array blocks each including a plurality of partial blocks, a plurality of global word lines, and odd-numbered and even-numbered sub word lines corresponding to each of the plurality of the global word lines, the odd-numbered sub word lines of each of odd-numbered partial blocks among the plurality of the partial blocks, respectively, connected to the odd-numbered sub word lines of each of the previous neighboring partial blocks, the even-numbered sub word lines of each of the odd-numbered partial blocks among the plurality of the partial blocks, respectively, connected to the even-numbered sub word lines of each of the next neighboring partial blocks, the odd-numbered sub word lines of each of even-numbered partial blocks among the plurality of the partial blocks, respectively, connected to the odd-numbered sub word lines of each of the next neighboring partial blocks, the even-numbered sub word lines of each of the even-numbered partial blocks among the plurality of the partial blocks, respectively, connected to the even-numbered sub word lines of each of the previous neighboring partial blocks; and a control means for selecting sub word lines of a corresponding partial block and sub word lines of a neighboring partial block connected to the sub word lines of the corresponding partial block when the corresponding partial block is selected in response to externally applied row and column address.

21 Claims, 10 Drawing Sheets

SEMICONDUCTOR MEMORY DEVICE AND METHOD OF SELECTING WORD LINE THEREOF

BACKGROUND OF THE INVENTION

1. Field of the Invention

The present invention relates to a semiconductor memory device and a method of selecting a word line thereof.

2. Description of Related Art

A conventional semiconductor memory device having a sub word line includes a plurality of memory blocks. In such a semiconductor memory device, when a row address is input in response to a row address strobe signal, one global word line is selected. When one global word line is selected, among a plurality of sub word lines, one sub word line corresponding to the selected global word line is selected. And, when a column address is input in response to a column address strobe signal, a bit line pair is selected. At this time, a selected memory cell in one memory cell array block receives or outputs a data. In other words, in the conventional semiconductor memory device having a sub word line, when one sub word line in one memory cell array block is selected, sub word lines of all partial blocks that constitute the memory cell array block are selected. As a result, since sub word lines of the memory cell array block that have not to be selected are selected, power consumption is high.

Also, the conventional semiconductor memory device having a sub word line receives a row address before receiving a column address to perform a read operation and a write operation, and thus cannot select a sub word line of a certain memory cell array partial block in a memory cell array block.

Meanwhile, a fast cycle random access memory (FCRAM) device simultaneously receives a row address and a column address to select partial blocks that constitute the memory cell array block to select a sub word line in the partial blocks. However, the FCRAM device can greatly improve a data transmission rate but has a problem in that a chip size becomes large.

A high-speed RAM device disclosed in the U.S. Pat. No. 6,108,243 selects only sub word lines in selected partial blocks among partial blocks that constitute a memory cell array block. However, the RAM device can reduce power consumption but has a problem in that a layout area size is increased.

SUMMARY OF THE INVENTION

An embodiment of the present invention comprises a semiconductor memory device. The device includes a plurality of memory cell array blocks each including a plurality of partial blocks in one of either a first or a second partial block group, a plurality of global word lines and a plurality of sub word lines in one of either a first or second sub word line group, corresponding to each of the plurality of the global word lines. In partial blocks of the first partial block group, sub word lines of the first sub word line group are connected to sub word lines of the first sub word line group of a previous block, and sub word lines of the second sub word line group are connected to sub word lines of the second sub word line group of a next partial block. In partial blocks in the second partial block group, sub word lines of the first sub word line group are connected to sub word lines of the first sub word line group of the next partial block, and sub word lines of the second sub word line group are connect to sub word lines of the second sub word line group of a previous partial block. A control means is provided for selecting sub word lines of a corresponding partial block and sub word lines of a neighboring partial block connected to the sub word lines of the corresponding partial block when the corresponding partial block is selected in response to externally applied row and column address.

An alternative embodiment of the present invention provides a semiconductor memory device, comprising: a plurality of memory cell array blocks each including a plurality of partial blocks, a plurality of global word lines, and odd-numbered and even-numbered sub word lines corresponding to each of the plurality of the global word lines, the odd-numbered sub word lines of each of odd-numbered partial blocks among the plurality of the partial blocks, respectively, connected to the odd-numbered sub word lines of each of the previous neighboring partial blocks, the even-numbered sub word lines of each of the odd-numbered partial blocks among the plurality of the partial blocks, respectively, connected to the even-numbered sub word lines of each of the next neighboring partial blocks, the odd-numbered sub word lines of each of even-numbered partial blocks among the plurality of the partial blocks, respectively, connected to the odd-numbered sub word lines of each of the next neighboring partial blocks, the even-numbered sub word lines of each of the even-numbered partial blocks among the plurality of the partial blocks, respectively, connected to the even-numbered sub word lines of each of the previous neighboring partial blocks; and a control means for selecting sub word lines of a corresponding partial block and sub word lines of a neighboring partial block connected to the sub word lines of the corresponding partial block when the corresponding partial block is selected in response to externally applied row and column address.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, example of which is illustrated in the accompanying drawings.

Figure 1:
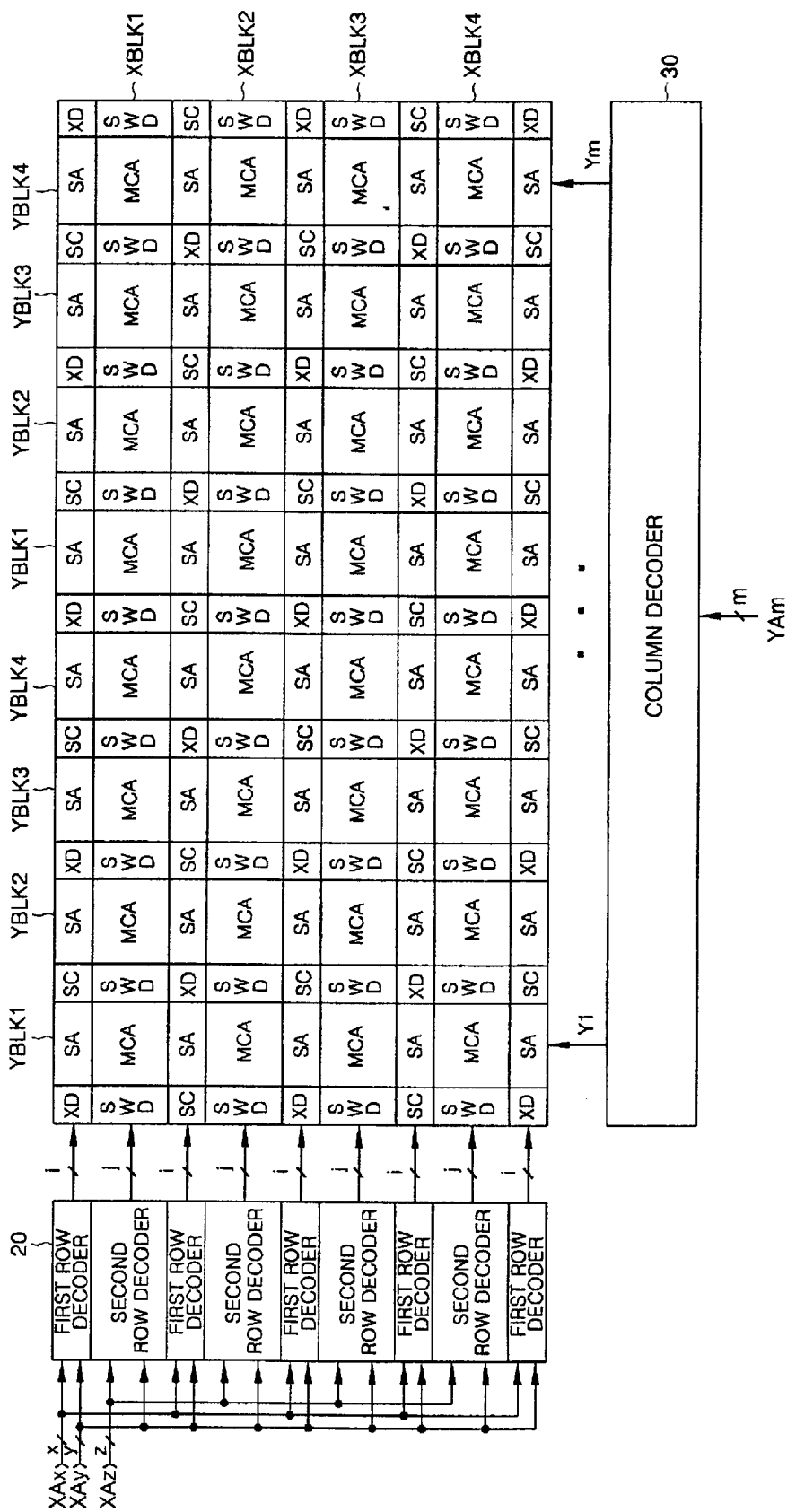
FIG. 1 is a block diagram illustrating a conventional semiconductor memory device having a sub word line, in accordance with the prior art.

Turning now to the drawings, FIG. 1 is a block diagram illustrating a conventional semiconductor memory device having a sub word line. The semiconductor memory device of FIG. 1 includes a memory cell array 10, a row decoder 20 and a column decoder 30.

The memory cell array 10 includes memory cell array blocks XBLK1 to XBLK4, partial blocks YBLK1 to YBLK4 of respective memory cell array blocks XBLK1 to XBLK4, sub word line drivers SWD arranged on right and left sides of the partial blocks YBLK1 to YBLK4, bit line sense amplifiers SA arranged on upper and lower sides of the memory cell array blocks XBLK1 to XBLK4, and drivers XD and a sensing enable control signal generating circuit SC arranged at crossing points of the bit line sense amplifier SA and the sub word line drivers SWD. The row decoder 20 includes first and second row decoders.

The first row decoder decodes a pre-decoded x-bit first row address XAx and a pre-decoded y-bit second row address XAy to generate an i-bit first decoding signal. The second row decoder decodes a pre-decoded z-bit third row address XAz and a pre-decoded y-bit second row address XAy to generate a j-bit second decoding signal. The column decoder 30 decodes an m-bit column address YAm to generate an n-number of column selecting signals Y1 to Yn.

Figure 2:
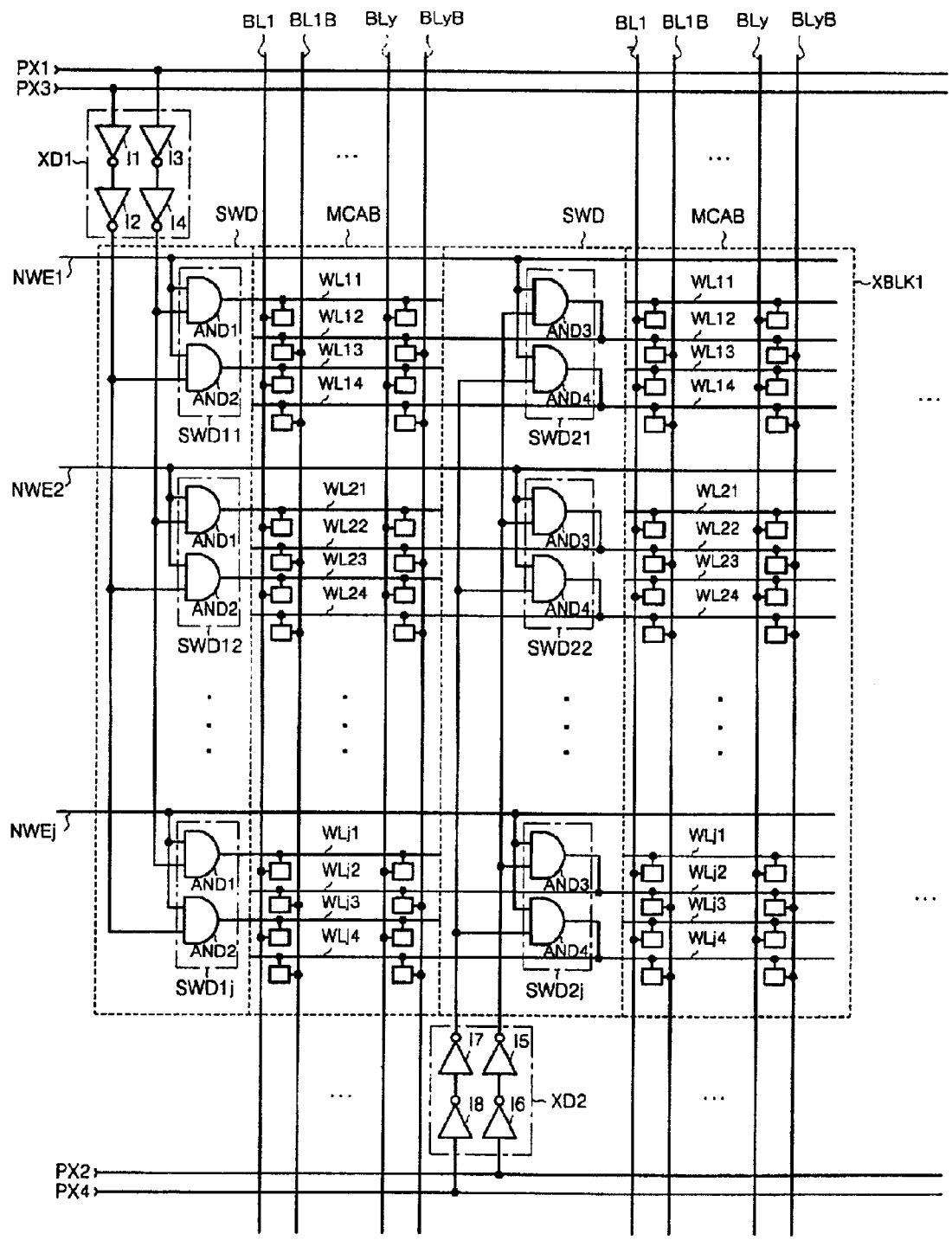
FIG. 2 is a block diagram illustrating a memory cell array block, in accordance with the prior art.

FIG. 2 is a block diagram illustrating the memory cell array block XBLK1 of FIG. 1. The memory cell array block XBLK1 of FIG. 2 shows that the first row decoders arranged at the upper and lower sides of the second row decoder generate two first decoding signals PX1 and PX3, and PX2 and PX4, respectively.

In the memory cell array block XBLK1 of FIG. 2, the sub word line driver SWD and the memory cell array partial blocks MCAB are arranged by turns. In other words, the sub word line driver SWD connected to odd-numbered sub word lines including sub word line drivers SWD11 to SWD1j which respectively include AND gates AND1, AND2 and the sub word line driver SWD connected to even-numbered sub word lines including sub word line drivers SWD21 to SWD2j which respectively include AND gates AND3, AND 4 are arranged, in turn, on right and left sides of the cell array partial blocks MCAB.

For purposes of this discussion, odd-numbered partial blocks and sub word lines may be referred to as partial blocks of a first partial block group, and sub word lines of a first sub word line group, respectively. Similarly, even-numbered partial blocks and sub word lines may be referred to as partial blocks of a second partial block group, and sub word lines of a second sub word line group, respectively.

The AND gate AND1 selects the sub word lines WL11 to WLj1 by ANDing the first decoding signal PX1 and signals transferred to corresponding global word lines NWE1 to NWEj. The AND gate AND2 selects the sub word lines WL13 to WLj3 by ANDing the first decoding signal PX3 and signals transferred to corresponding global word lines NWE1 to NWEj.

The AND gate AND3 selects the sub word lines WL12 to WLj2 by ANDing the first decoding signal PX2 and signals transferred to corresponding global word lines NWE1 to NWEj. The AND gate AND4 selects the sub word lines WL14 to WLj4 by ANDing the first decoding signal PX4 and signals transferred to corresponding global word lines NWE1 to NWEj.

The memory cell array partial blocks MCAB each includes memory cells MC each connected to each of the sub word lines WL11 to WL14~WLj1 to WLj4 and each of bit line pairs BL1 and BL1B to BLy and BLyB.

The driver XD1 includes inverters I1 and I2 to drive the first decoding signal PX1 and inverters I3 and I4 to drive the first decoding signal PX3, and the driver XD2 includes inverters I5 and I6 to drive the first decoding signal PX2 and inverters I7 and I8 to drive the first decoding signal PX4.

An operation of the memory cell array block of FIG. 2 is described below.

When a row address is input in response to a row address strobe signal during a read operation or a write operation, a signal having a logic "high" level is applied to the global word line NWE1. When the first decoding signal PX1 having a logic "high" level is generated, the AND gate AND1 of the sub word line driver SWD11 generates a signal having a logic "high" level. Hence, the sub word line WL11 is selected, and every memory cell MC connected to the sub word line WL11 transfers data to the bit line pair of BL1 and BL1B. That is, all memory cells MC connected to the sub word line WL11 of the partial blocks MCAB of the memory cell array block XBLK1 are selected. And, when a column address is input in response to a column address strobe signal and the bit line pair of BL1 and BL1B is selected by the column decoder 30, data is input to or output from the bit line pair of BL1 and BL1B.

Figure 3:
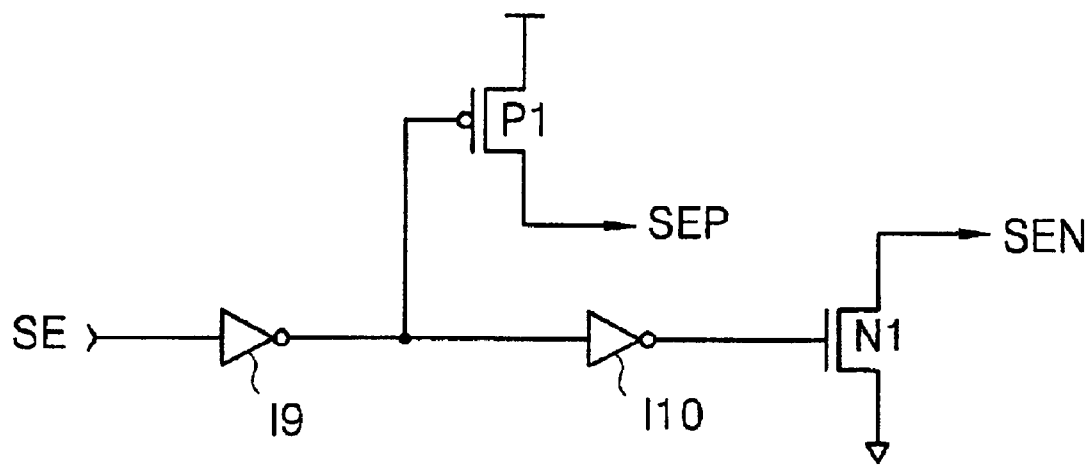
FIG. 3 is a block diagram illustrating a sensing enable control signal generating circuit, in accordance with the prior art.

FIG. 3 is a block diagram illustrating the sensing enable control signal generating circuit SC of FIG. 1. The sensing enable control signal generating circuit SC of FIG. 3 includes inverters I9 and I10, a PMOS transistor P1, and an NMOS transistor N1.

The inverter I9 inverts a sense amplifier enable signal SE. The PMOS transistor P1 supplies a power voltage to a PMOS bit line sense amplifier in response to an output signal of the inverter I9 having a logic "low" level. That is, the PMOS transistor P1 changes a control signal SEP to a power voltage.

The inverter I10 inverts an output signal of the inverter I9. The NMOS transistor N1 supplies a ground voltage to a NMOS bit line sense amplifier in response to an output signal of the inverter I10 having a logic "high" level. That is, the NMOS transistor N1 changes a control signal SEN to a ground voltage.

Even though not shown, the bit line sense amplifier includes the PMOS bit line sense amplifier and the NMOS bit line sense amplifier. The PMOS bit line sense amplifier includes two PMOS transistors serially connected to the bit line pair, and the PMOS bit line sense amplifier includes two NMOS transistors serially connected to the bit line pair.

The sense amplifier enable signal SE of FIG. 3 is a signal generated by receiving the pre-decoded y-bit second row address XAy to select the memory cell array blocks XBLK1 to XBLK4. In other words, the sense amplifier enable signal SE is a signal to enable the sense amplifiers SA arranged on the upper and lower sides of the corresponding memory cell array block.

As described above, in the conventional semiconductor memory device, when a row address is input in response to the row address strobe signal, the memory cell array block is selected, and all sub word lines, selected by the same decoding signal, of all partial blocks constituting the selected memory cell array block are selected.

However, during a read operation or a write operation, data are input into or output from not all of the partial blocks constituting the selected memory cell array blocks but only partial blocks selected by the column address. Accordingly, the memory cells connected to the sub word lines selected during a read operation or a write operation output data to the bit line pairs of BL1 and BL1B to BLy ad BLyB, and thus a cell restoring operation has to be performed to restore data of memory cells connected to the sub word lines selected after a read operation and a write operation. In other words, the sense amplifiers arranged on the upper and lower sides of the selected memory cell array block have to be operated. That is, the conventional semiconductor memory device operates not only partial blocks selected during a read operation or a write operation but also all partial blocks constituting the selected memory cell array block, thereby increasing power consumption.

Meanwhile, in a conventional fast cycle random access memory (FCRAM) device, since a row address and a column address to select the partial blocks of the memory cell array block are simultaneously input, only sub word lines of the selected partial block of the memory cell array block can be selected.

Figure 4:
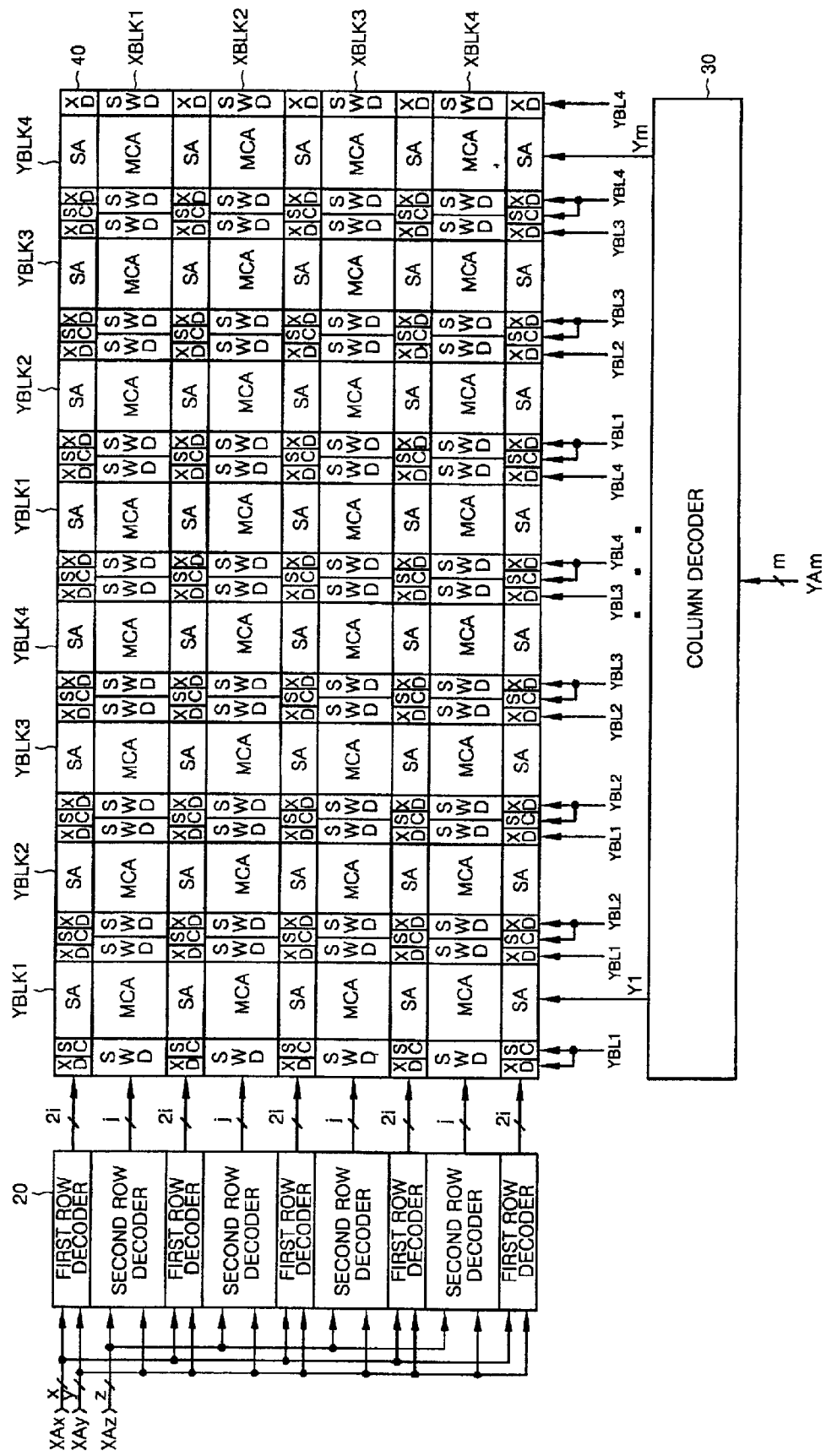
FIG. 4 is a block diagram illustrating an FCRAM device, in accordance with the prior art.

FIG. 4 is a block diagram illustrating the FCRAM device disclosed in the U.S. Pat. No. 6,108,243. The FCRAM of FIG. 4 includes a memory cell array 40, a row decoder 50 and a column decoder 60.

The memory cell array 10 includes memory cell array blocks XBLK1 to XBLK4, partial blocks YBLK1 to YBLK4 of respective memory cell array blocks XBLK1 to XBLK4, sub word line drivers SWD arranged on right and left sides of the partial blocks YBLK1 to YBLK4, bit line sense amplifiers SA arranged on upper and lower sides of the memory cell array blocks XBLK1 to XBLK4, drivers XD arranged on right and left sides of the bit line sense amplifier SA, and a sensing enable control signal generating circuit SC arranged between two drivers XD. The row decoder 50 includes first and second row decoders.

The first row decoder decodes a pre-decoded x-bit first row address XAx and a pre-decoded y-bit second row address XAy to generate a 2i-bit first decoding signal. The second row decoder decodes a pre-decoded z-bit third row address XAz and a pre-decoded y-bit second row address XAy to select the memory cell array blocks XBLK1 to XBLK4 and generates a j-bit second decoding signal. The column decoder 60 decodes an m-bit column address YAm to generate an n-number of column selecting signals Y1 to Yn.

The drivers XD receive corresponding partial block selecting signals YBL1 to YBL4 and select corresponding partial blocks in order to drive a 2i-bit first decoding signal, respectively. The sensing enable control signal generating circuits SC receive corresponding partial block selecting signals YBL1 to YBL4 and apply a control signal to the sense amplifier SA of the selected corresponding partial blocks.

Figure 5:
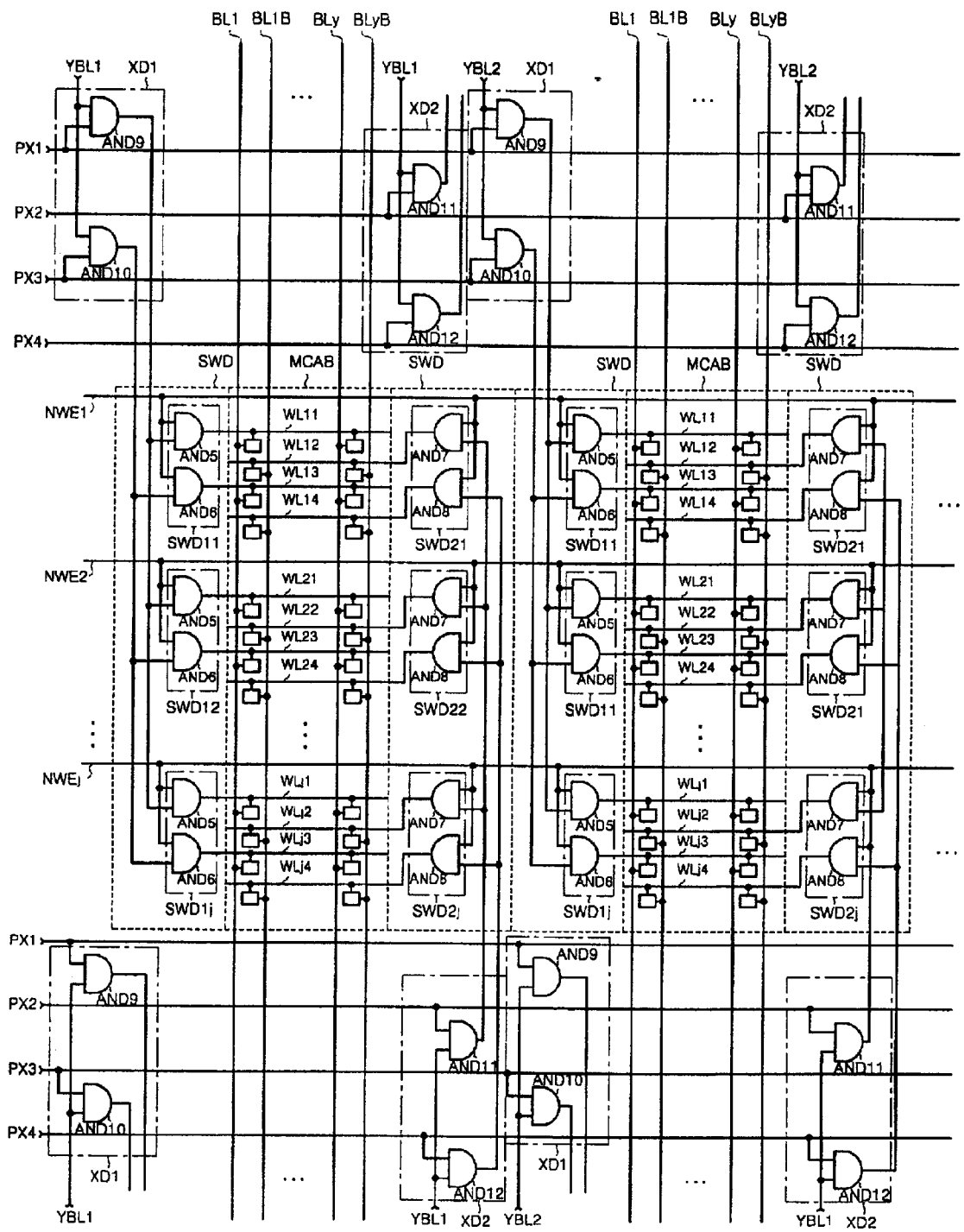
FIG. 5 is a block diagram illustrating a memory cell array block of an FCRAM, in accordance with the prior art.

FIG. 5 is a block diagram illustrating the memory cell array block XBLK1 of FIG. 4. The memory cell array block XBLK1 of FIG. 4 shows that the first row decoders arranged at the upper and lower sides of the second row decoder generate two 4-bit first decoding signals PX1 to PX4, respectively. In other words, fourth first decoding signals PX1 to PX4 are generated by the first row decoders of FIG. 2 arranged at the upper and lower sides of the second row decoder, but each of the first row decoders of FIG. 5 arranged at the upper and lower sides of the second row decoder generates four first decoding signals PX1 to PX4.

The drivers XD1, arranged on the upper and lower sides of the sub word line drivers SWD arranged on a left side of respective partial blocks MCAB, include AND gates AND9 and AND10, respectively. The AND gate AND9 ANDs each of the block selecting signals YBL1 to YBL4 and the first decoding signal PX1, and the AND gate AND10 ANDs each of the block selecting signals YBL1 to YBL4 and the first decoding signal PX3.

The drivers XD2, arranged on the upper and lower sides of the sub word line drivers SWD arranged on a right side of respective partial blocks MCAB, include AND gates AND11 and AND12, respectively. The AND gate AND11 ANDs each of the block selecting signals YBL1 to YB14 and the first decoding signal PX2, and the AND gate AND12 ANDs each of the block selecting signals YBL1 to YBL4 and the first decoding signal PX3.

The sub word line drivers SWD11 to SWD1j arranged on a left side of respective partial blocks MCAB include AND gates AND5 and AND6, respectively. The AND gate AND5 selects the sub word lines WL11 to WLj1 by ANDing an output signal of the AND gate AND9 and signals transferred to corresponding global word lines NWE1 to NWEj. The AND gate AND6 selects the sub word lines WL13 to WLj3 by ANDing an output signal of the AND gate AND10 and signals transferred to corresponding global word lines NWE1 to NWEj.

The sub word line drivers SWD21 to SWD2j arranged on a right side of respective partial blocks MCAB include AND gates AND7 and AND8, respectively. The AND gate AND7 selects the sub word lines WL12 to WLj2 by ANDing an output signal of the AND gate AND11 and signals transferred to corresponding global word lines NWE1 to NWEj. The AND gate AND8 selects the sub word lines WL14 to WLj4 by ANDing an output signal of the AND gate AND 12 and signals transferred to corresponding global word lines NWE1 to The memory cell array partial blocks MCAB each includes memory cells MC each connected to each of the sub word lines WL11 to WL14~WLj1 to WLj4 and each of bit line pairs of BL1 and BL1B to BLy and BLyB.

An operation of the memory cell array block of FIG. 5 is described below. When a row address and a column address are input during a read operation or a write operation, a signal having a logic "high" level is applied to the global word line NWE1. When the first decoding signal PX1 having a logic "high" level and the block selecting signal YBL1 having a logic "high" level are generated, the AND gate AND9 generates a signal having a logic "high" level. Hence, the AND gate AND5 of the sub word line driver SWD1 transfers a signal having a logic "high" level to the sub word line WL11 by ANDing a signal having a logic "high" level transferred to the global word line NWE1 and an outputting signal of the AND gate AND9 having a logic "high" level. In other words, the sub word line WL11 is selected, and every memory cell MC connected to the sub word line WL11 outputs data to the bit line pair of BL1 and BL1B. That is, all memory cells MC connected to the sub word line WL11 of the first partial block MCAB of the memory cell array block XBLK1 are selected.

The memory cells MC connected to the sub word line WL11 of the first partial block MCAB of the memory cell array block XBLK1 transfers data to the bit line pairs of BL1, BL1B to BLy, BLyB. That is, The memory cells MC connected to the sub word line WL11 of the first partial block MCAB of the memory cell array block XBLK1 are selected.

Figure 6:
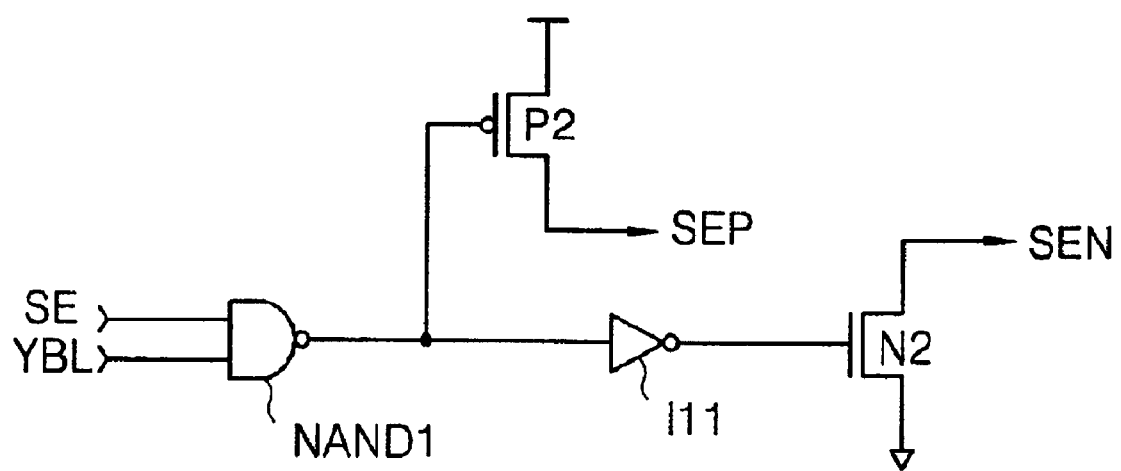
FIG. 6 is a block diagram illustrating a sensing enable control signal generating circuit of an FCRAM, in accordance with the prior art.

FIG. 6 is a block diagram illustrating a sensing enable control signal generating circuit SC of FIG. 4. The sensing enable control signal generating circuit SC of FIG. 6 includes a NAND gate NAND1, an inverter I11, a PMOS transistor P2, and an NMOS transistor N2.

The NAND gate NAND1 NANDs the block selecting signal YBL to select a corresponding partial block and a sense amplifier enable signal SE enabled by the block selecting signal to select a corresponding memory cell array block. The inverter I11 inverts an output signal of the NAND gate NAND1. The PMOS transistor P2 supplies a power voltage in response to an output signal of the NAND gate NAND1 having a logic "low" level. That is, the PMOS transistor P2 outputs a power voltage as a control signal SEP. The NMOS transistor N2 supplies a ground voltage in response to an output signal of the inverter I11 having a logic "high" level. That is, the NMOS transistor N2 outputs a ground voltage as a control signal SEN.

The conventional FCRAM device includes the sub word line drivers and the sensing enable control signal generating circuit SC for the exclusive use of respective partial blocks constituting the memory cell array blocks to select only the sub word lines of the selected partial blocks, thereby decreasing power consumption.

However, the conventional FCRAM device has a problem in that a layout area size is increased due to the sub word line drivers and the sensing enable control signal generating circuit SC for the exclusive use of respective partial blocks constituting the memory cell array blocks.

Figure 7:
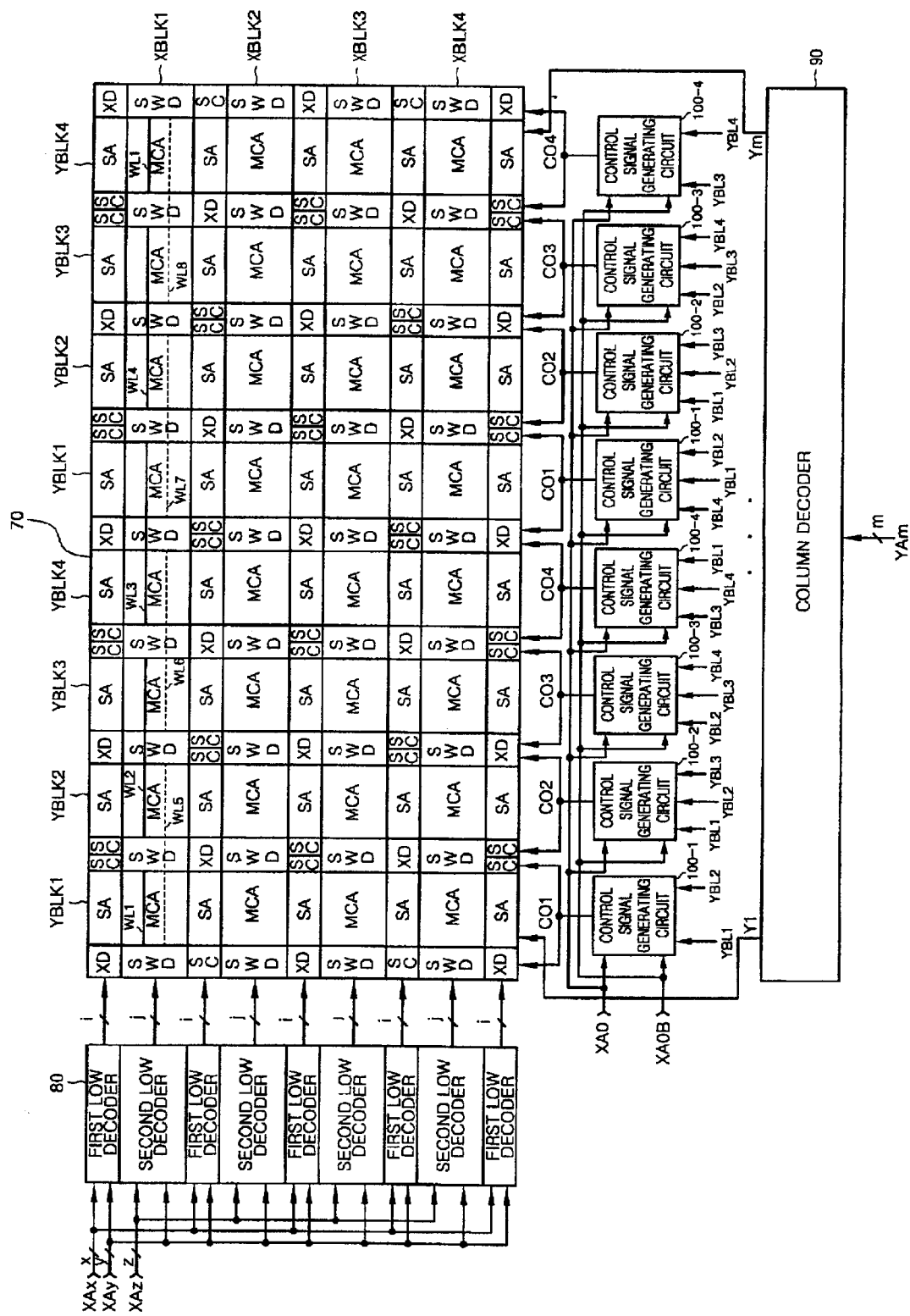
FIG. 7 is a block diagram illustrating a semiconductor memory device according to the present invention.

FIG. 7 is a block diagram illustrating a semiconductor memory device according to the present invention. The semiconductor memory device of FIG. 7 includes a memory cell array block 70, a row decoder 80, a column decoder 90, and control signal generating circuits 100-1 to 100-4.

The memory cell array 70 has the same configuration as that of FIG. 1 except a configuration of the drivers XD and the sensing enable control signal generating circuit SC. The row decoder 80 and the column decoder 90 of FIG. 7 have the same configuration as those of FIG. 1.

The control signal generating circuits 100-1 to 100-4 receive least significant bits XA0 and XA0B among row addresses, a block selecting signal to select a corresponding partial block, and a block selecting signal to select neighboring partial blocks, respectively, to generate control signals CO1 to CO4. That is, the control signal generating circuit 100-1 receives the least significant bits XA0 and XA0B and the partial block selecting signals YBL1 and YBL2 to generate a control signal CO1.

An operation of the control signal generating circuits 100-1 to 100-4 of FIG. 7 is described below.

When the least significant bit row address XA0 has a logic "low" level, odd-numbered word lines WL1 to WL4 are selected. When the least significant bit row address XA0 has a logic "high" level, even-numbered word lines WL5 to WL8 are selected.

In the case that the least significant bit row address XA0 has a logic "low" level, the control signal generating circuits 100-1 to 100-4 control to respectively select the sub word lines WL1 and WL3, and WL2 and WL4 when the odd-numbered block selecting signals YBL1 and YBL3 are generated, and control to respectively select the sub word lines WL2 and WL4, and WL1 and WL3 when the even-numbered block selecting signals YBL2 and YBL4 are generated. In other words, when the odd-numbered block selecting signals YBL1 and YBL3 are generated, the corresponding sub word lines of a previous block are selected. When the even-numbered block selecting signals YBL2 and YBL4 are generated, the corresponding sub word lines of the next block are selected.

In the case that the least significant bit row address XA0B has a logic "high" level, the control signal generating circuits 100-1 to 100-4 control to respectively select the sub word lines WL5 and WL7, and WL6 and WL8 when the odd-numbered block selecting signals YBL1 and YBL3 are generated, and control to respectively select the sub word lines WL5 and WL7, and WL6 and WL8 when the even-numbered block selecting signals YBL2 and YBL4 are generated. In other words, when the odd-numbered block selecting signals YBL1 and YBL3 are generated, the corresponding sub word lines of the next block are selected. When the even-numbered block selecting signals YBL2 and YBL4 are generated, the corresponding sub word lines of the previous block are selected.

The sensing enable control signal generating circuit SC includes a sensing enable control signal generating circuit SC to control the bit line sense amplifiers on a left side thereof and a sensing enable control signal generating circuit SC to control the bit line sense amplifiers on a right side thereof, separately. The sensing enable control signal generating circuit SC controls the bit line sense amplifiers of the corresponding partial block in response to the control signals CO1 to CO4.

Figure 8:
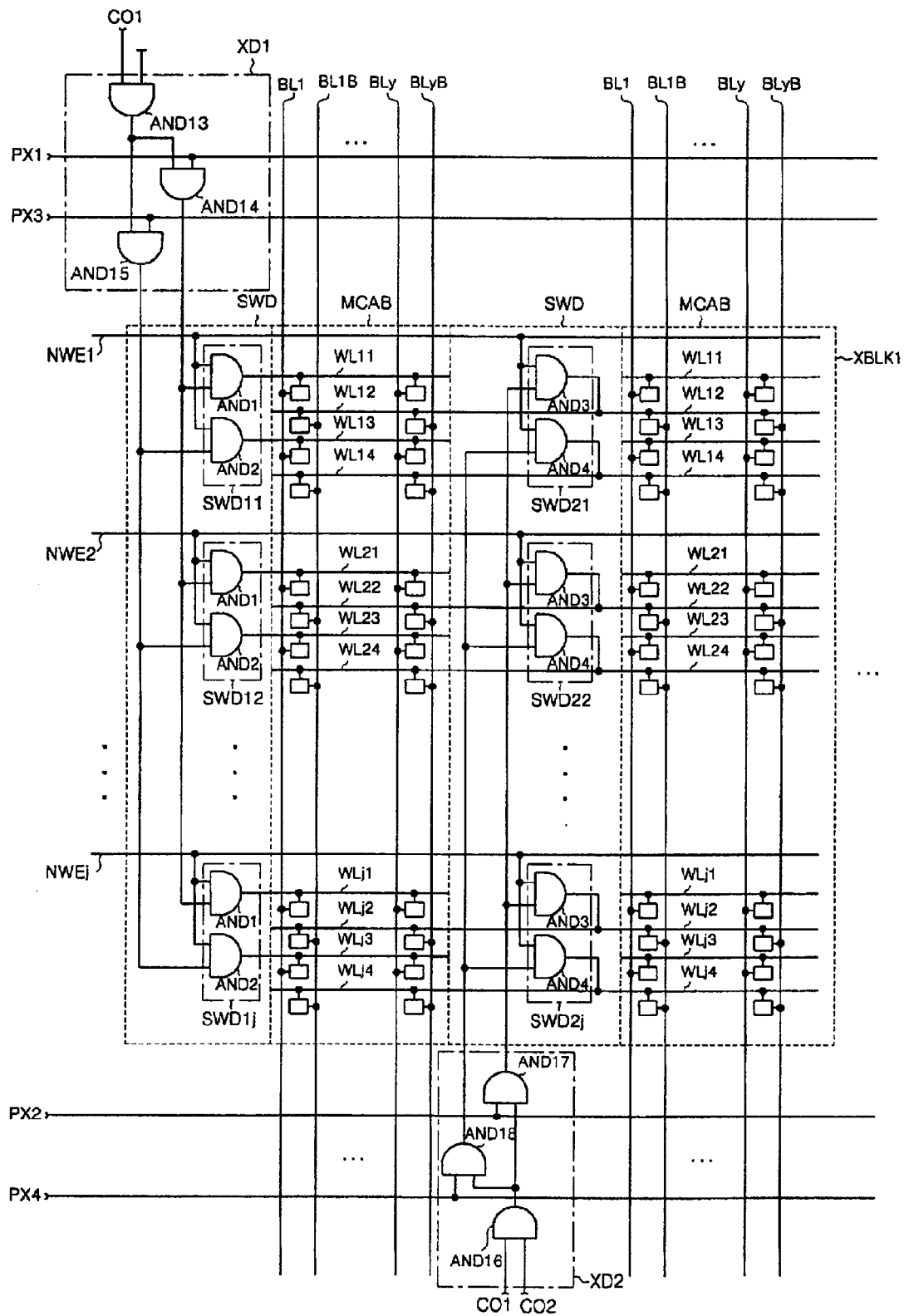
FIG. 8 is a block diagram illustrating a memory cell array block, in accordance with the present invention.

FIG. 8 is a block diagram illustrating the memory cell array block XBLK1 of FIG. 7. The memory cell array block XBLK1 has the same configuration as that of FIG. 2 except the following: the drivers XD1 and XD2 differ in configuration from those of FIG. 2, respectively. In other words, the driver XD1 is arranged on an upper side of the sub word line driver SWD arranged on a left side of the partial block MCAB, and the driver XD2 is arranged on a lower side of the sub word line driver SWD arranged on a right side of the partial block MCAB.

The driver XD1 includes AND gates AND13 to AND 15. The AND gate AND13 ANDs the control signal CO1 and a signal having a logic "high" level. The AND gate AND14 ANDs an output signal of the AND gate AND13 and the decoding signal PX1. The AND gate AND15 ANDs an output signal of the AND gate AND13 and the decoding signal PX3.

The driver XD2 includes AND gates AND16 to AND18. The AND gate AND16 ANDs the control signals CO1 and CO2. The AND gate AND17 ANDs an output signal of the AND gate AND16 and the decoding signal PX2. The AND gate AND18 ANDs an output signal of the AND gate AND16 and the decoding signal PX4.

Even though the AND gates AND13 and 16 are arranged in the drivers XD1 and XD2, respectively, they can be arranged in the control signal generating circuits 100-1 to 100-4 or the column decoder 90.

An operation of the memory cell array block XBLK1 of FIG. 8 is described below.

Parts of the row address and the column address are input during a read operation or a write operation. At this time, a signal having a logic "high" level is applied to the global word line NWE1 by decoding the input row and column addresses. When the first decoding signal PX1 having a logic "high" level and the control signal CO1 having a logic "high" level are generated, the AND gate AND13 generates a signal having a logic "high" level. Hence, the AND gate AND1 generates a signal having a logic "high" level to select the sub word line WL11. At the same time, the control signal generating circuit 100-4 of FIG. 7 generates the control signal CO4. As a result, the sub word lines WL1 and WL3 of the first, the fourth, the fifth, and the eighth partial blocks of the memory cell array XBLK1 are simultaneously selected. But, the sub word lines WL2 and WL4 of the other partial blocks are not selected.

In the same way, a signal having a logic "high" level is applied to the global word line NWE1 by decoding the input row and column addresses. When the first decoding signal PX2 having a logic "high" level and the control signals CO1 and CO2 having a logic "high" level are generated, the AND gate AND15 generates a signal having a logic "high" level. And, the AND gate AND16 generates a signal having a logic "high" level, and the AND gate AND3 generates a signal having a logic "high" level. As a result, the sub word line WL12 are selected. At the same time, the control signal generating circuit 100-1 of FIG. 7 generates the control signal CO1. Accordingly, the sub word lines WL5 and WL7 of the first, the second, the fifth, and the sixth partial blocks of the memory cell array XBLK1 are simultaneously selected. But, the sub word lines WL6 and WL8 of the other partial blocks are not selected.

Figure 9A:
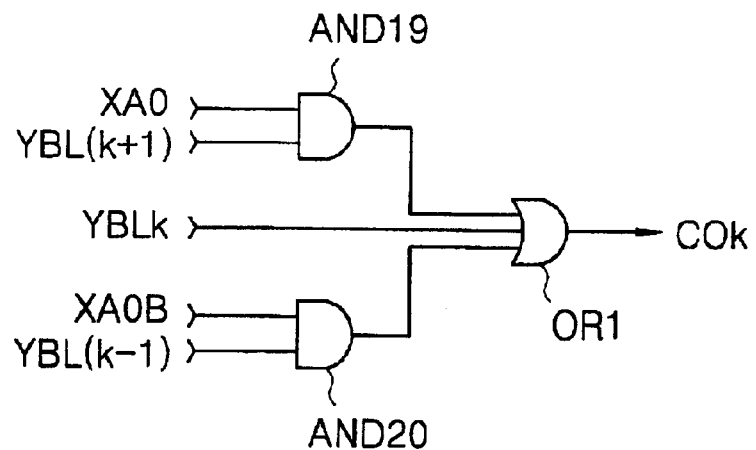
FIGS. 9A and 9B are circuit diagrams illustrating control signal generating circuits, according to the present invention.
Figure 9B:
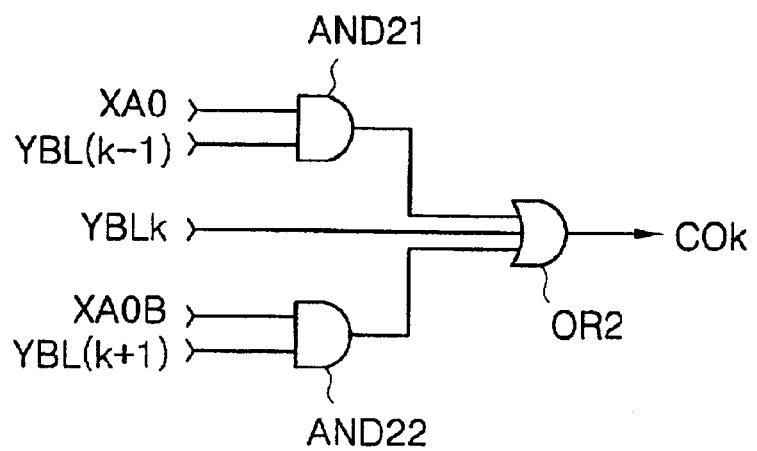

FIGS. 9A and 9B are circuit diagrams illustrating the control signal generating circuits 100-1 to 100-4 of FIG. 7. FIG. 9A shows the control signal generating circuits 100-1 and 100-3, from FIG. 7, that generate control signals to control the odd-numbered partial blocks. The control signal generating circuits 100-1 and 100-3 include AND gates AND19 and AND20 and an OR gate OR1.

FIG. 9B shows the control signal generating circuits 100-2 and 100-4, from FIG. 7, that generate control signals to control the even-numbered partial blocks. The control signal generating circuits 100-2 and 100-4 include AND gates AND21 and AND22 and an OR gate OR2.

In FIGS. 9A and 9B, a reference YBLk denotes a corresponding partial block selecting signal, a reference YBL(k+1) denotes a next partial block selecting signal, and a reference YBL(k−1) denotes a previous partial block selecting signal.

An operation of the control signal generating circuit of FIGS. 9A and 9B is described below.

When the least significant bit address XA0 having a logic "high" level and the next partial block selecting signal YBL(k+1) having a logic "high" level are generated, the AND gate AND19 generates a signal having a logic "high" level. When the least significant bit address XA0B having a logic "low" level and the previous partial block selecting signal YBL(k−1) having a logic "high" level are generated, the AND gate AND20 generates a signal having a logic "low" level. The OR gate OR1 generates a control signal COk having a logic "high" level when at least one of the corresponding partial block selecting signal YBLk and the output signals of the AND gates AND19 and AND20 has a logic "high" level.

When the least significant bit address XA0 having a logic "high" level and the previous partial block selecting signal YBL(k−1) having a logic "high" level are generated, the AND gate AND21 generates a signal having a logic "high" level. When the least significant bit address XA0B having a logic "low" level and the next partial block selecting signal YBL(k+1) having a logic "high" level are generated, the AND gate AND22 generates a signal having a logic "low" level. The OR gate OR2 generates a control signal COk having a logic "high" level when at least one of the corresponding partial block selecting signal YBLk and the output signals of the AND gates AND21 and AND22 has a logic "high" level.

As one example, when the least significant bit address XA0 has a logic "low" level and the third partial block is activated, the control signal generating circuits 100-2 and 100-3 generate the control signals CO2 and CO3 having a logic "high" level, respectively. Also, when the least significant bit address XA0 has a logic "low" level and the second partial block is activated, the control signal generating circuits 100-2 and 100-3 generate the control signals CO2 and CO3 having a logic "high" level, respectively. In these cases, the control signals CO2 and CO3 are applied to the driver XD through a region of the sub word line driver SWD. Or, a control signal generated by ANDing the control signals CO2 and CO3 is applied to the driver XD through a region of the sub word line driver SWD.

As another example, when the least significant bit address XA0 has a logic "high" level and the third partial block is activated, the control signal generating circuits 100-3 and 100-4 generate the control signals CO3 and CO4 having a logic "high" level, respectively. Also, when the least significant bit address XA0 has a logic "high" level and the fourth partial block is activated, the control signal generating circuits 100-3 and 100-4 generate the control signals CO3 and CO4 having a logic "high" level, respectively. In these cases, the control signals CO3 and CO4 are applied to the driver XD through a region of the sub word line driver SWD. Or, a control signal generated by ANDing the control signals CO3 and CO4 is applied to the driver XD through a region of the sub word line driver SWD.

Figure 10:
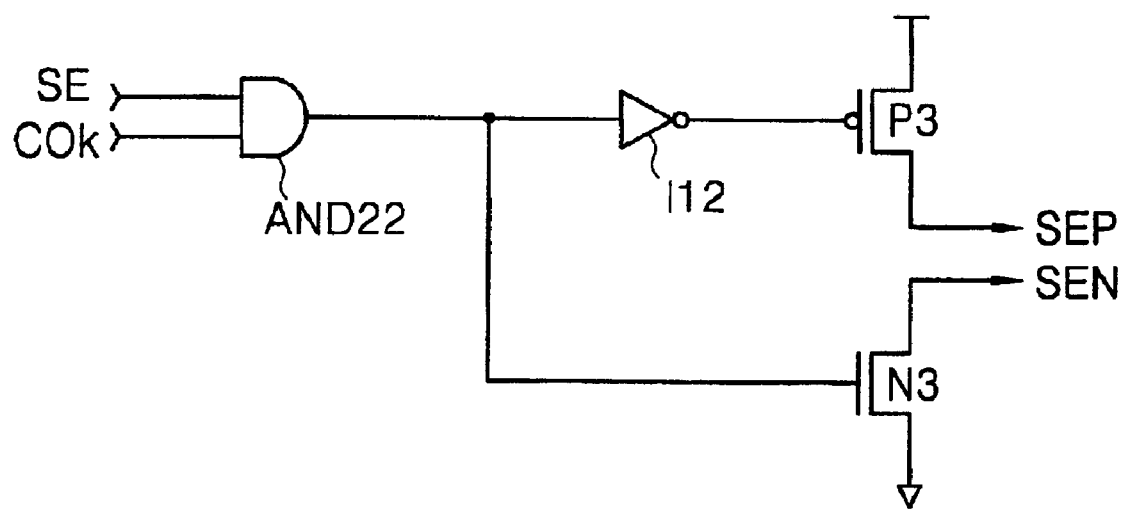
FIG. 10 is a block diagram illustrating a sensing enable control signal generating circuit, in accordance with the present invention.

FIG. 10 is a block diagram illustrating a sensing enable control signal generating circuit SC of FIG. 7. The sensing enable control signal generating circuit SC of FIG. 10 includes an AND gate AND23, an inverter I12, a PMOS transistor P3, and an NMOS transistor N3. In FIG. 10, a reference COk denotes a control signal of the corresponding partial block.

An operation of the sensing enable control signal generating circuit SC of FIG. 10 is described below.

The AND gate AND23 generates a signal having a logic "high" level when a sense amplifier enable signal SE having a logic "high" level and the control signal COk having a logic "high" level are generated. The inverter I12 inverts a signal having a logic "high" level to generate a logic "low" level. The NMOS transistor N3 generates a ground voltage as a control signal SEN in response to an output signal of the AND gate AND23 having a logic "high" level. The PMOS transistor P3 generates a power voltage as a control signal SEP in response to an output signal of the inverter I12 having a logic "low" level.

The sensing enable control signal generating circuit SC of FIG. 10 includes control circuits that control different bit line sense amplifiers of different partial blocks, respectively. For example, the first sensing enable control signal generating circuit SC arranged on an upper side of the memory cell array block XBLK1 includes two control circuits SC: one is to generate a sensing enable control signal in response to a control signal CO1, and the other is to generate a sensing enable control signal in response to a control signal CO2. Also, the first sensing enable control signal generating circuit SC arranged on an lower side of the memory cell array block XBLK1 includes one control circuit SC to generate a sensing enable control signal in response to the control signal CO1. By the method described above, only the sense amplifiers arranged at the upper and lower sides of the partial blocks having the selected sub word lines can be controlled to be enabled.

As described herein before, in the case that a row address and a column address are simultaneously input, the inventive semiconductor memory device does not select the sub word lines of all partial blocks in the memory cell array block, but select only the sub word lines of the selected partial block and the sub word lines of the partial block neighboring on the selected partial block. Hence, a layout area size as well as power consumption can be reduced.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device, comprising:

a plurality of memory cell array blocks each including a plurality of partial blocks, a plurality of global word lines, and odd-numbered and even-numbered sub word lines corresponding to each of the plurality of the global word lines, the odd-numbered sub word lines of each of odd-numbered partial blocks among the plurality of the partial blocks, respectively, connected to the odd-numbered sub word lines of each of the previous neighboring partial blocks, the even-numbered sub word lines of each of the odd-numbered partial blocks among the plurality of the partial blocks, respectively, connected to the even-numbered sub word lines of each of the next neighboring partial blocks, the odd-numbered sub word lines of each of even-numbered partial blocks among the plurality of the partial blocks, respectively, connected to the odd-numbered sub word lines of each of the next neighboring partial blocks, the even-numbered sub word lines of each of the even-numbered partial blocks among the plurality of the partial blocks, respectively, connected to the even-numbered sub word lines of each of the previous neighboring partial blocks; and a control means for selecting sub word lines of a corresponding partial block and sub word lines of a neighboring partial block connected to the sub word lines of the corresponding partial block when the corresponding partial block is selected in response to externally applied row and column address.

2. The device of claim 1, wherein the control means includes:

an odd-numbered partial block control means of each of the odd-numbered partial blocks for simultaneously selecting odd-numbered sub word lines of the neighboring partial block previous to the odd-numbered partial block when the odd-numbered sub word lines of the odd-numbered partial block are selected, and for simultaneously selecting even-numbered sub word lines of the neighboring partial block next to the odd-numbered partial block when the even-numbered sub word lines are selected; and an even-numbered partial block control means of each of the even-numbered partial blocks for simultaneously selecting odd-numbered sub word lines of the neighboring partial block next to the even-numbered partial block when the odd-numbered sub word lines of the even-numbered partial block are selected, and for simultaneously selecting even-numbered sub word lines of the neighboring partial block previous to the even-numbered partial block when the even-numbered sub word lines are selected.

3. The device of claim 2, wherein the odd-numbered partial block control means includes:

an odd-numbered partial block control signal generating means for generating a control signal when a first selecting signal to select the odd-numbered corresponding partial block or a second selecting signal to select the partial block previous to the corresponding partial block is input in case that the odd-numbered sub word lines of the odd-numbered partial block are selected, and when the first selecting signal or a third selecting signal to select the partial block next to the corresponding partial block is input in case that the even-numbered sub word lines are selected;

a plurality of drivers for generating decoding signals to designate the sub word lines in response to control signals generated from the odd-numbered partial block control signal generating means and the even-numbered neighboring partial blocks, and for being arranged by turns on left and right sides and upper and lower sides of the partial blocks; and a plurality of sense amplifier control means for generating a sense amplifier control signal in response to a sense amplifier enable signal generated in response to a block selecting signal to select the corresponding memory cell array block and a control signal generated from the odd-numbered partial block control signal generating means and for being arranged in turn on left and right sides and upper and lower sides of the partial blocks to cross the plurality of the drivers.

4. The device of claim 3, wherein the odd-numbered partial block control signal generating means includes:

a first AND circuit for ANDing an 1-bit row address having a first state to designate the odd-numbered sub word lines and the second selecting signal;

a second AND circuit for ANDing an 1-bit row address having a second state to designate the even-numbered sub word lines and the third selecting signal; and an OR circuit for ORing the first selecting signal and output signals of the first and second AND circuits to generate the control signal.

5. The device of claim 3, wherein each of the plurality of the sense amplifier control means includes:

a third AND circuit for ANDing a corresponding control signal and a corresponding sense amplifier enable signal;

a first NMOS transistor for generating a ground voltage as the first sense amplifier control signal in response to an output signal of the third AND circuit; and a first PMOS transistor for generating a power voltage as the second sense amplifier control signal in response to an output signal of the third AND circuit.

6. The device of claim 3, wherein the even-numbered partial block control means includes:

an even-numbered partial block control signal generating means for generating a control signal when a first selecting signal or a third selecting signal to select the even-numbered corresponding partial block is input in case that the odd-numbered sub word lines of the even-numbered partial block are selected, and when the first selecting signal or a second selecting signal is input in case that the even-numbered sub word lines are selected; and a plurality of sense amplifier control means for generating a sense amplifier control signal in response to a block selecting signal to select the corresponding memory cell array block and a control signal generated from the even-numbered partial block control signal generating means and for being arranged in turn on left and right sides and upper and lower sides of the partial blocks.

7. The device of claim 6, wherein the even-numbered partial block control signal generating means includes:
   a fourth AND circuit for ANDing an 1-bit row address having a first state to select the odd-numbered sub word lines and a fifth selecting signal;
   a fifth AND circuit for ANDing an 1-bit row address having a second state to select the even-numbered sub word lines and a six selecting signal; and
   a second OR circuit for ORing the fourth selecting signal and output signals of the fourth and fifth AND circuits to generate the control signal.

8. The device of claim 6, wherein each of the plurality of the sense amplifier control means includes:
   a sixth AND circuit for ANDing the corresponding control signal and the corresponding sense amplifier enable signal;
   a second NMOS transistor for generating a ground voltage as the first sense amplifier control signal in response to an output signal of the sixth AND circuit; and
   a second PMOS transistor for generating a power voltage as the second sense amplifier control signal in response to an output signal of the sixth AND circuit.

9. A semiconductor memory device, comprising:
   a memory cell array including a plurality of memory cell array blocks, the memory cell array block including a plurality of partial blocks, a plurality of global word lines, and odd-numbered and even-numbered sub word lines corresponding to each of the plurality of the global word lines;
   a plurality of sub word line drivers each including alternatively an odd-numbered sub word line driver and an even-numbered sub word line driver between each of the plurality of the partial blocks, the odd-numbered sub word line driver for outputting odd-numbered first signals to the odd-numbered sub word lines in response to a first row decoding signal transferred to the global word line, the even-numbered sub word line driver for even-numbered first control signals to the even-numbered sub word lines in response to the first row decoding signal;
   a plurality of sense amplifying means arranged on upper and lower sides of the plurality of the memory cell array blocks and between the neighboring partial blocks and performing a sensing operation in response to first and second sense amplifier control signals;
   a plurality of drivers alternatively arranged on crossing points of each of the plurality of the sub word line drivers and each of the plurality of the sense amplifying means, each of the plurality of the drivers including an odd-numbered driver and an even-numbered driver, the odd-numbered driver for outputting odd-numbered second row decoding signals as the odd-numbered first signal in response to a control signal to control the corresponding partial block and a control signal to control the neighboring partial block, the even-numbered driver for outputting even-numbered row decoding signals as the even-numbered first signal;
   a plurality of sense amplifier control means arranged on upper and lower sides of the crossing points alternately with the plurality of the drivers, and generating first and second sense amplifier control signals for respective sense amplifying means arranged on left and right sides thereof in response to a corresponding sense amplifier enable signal generated in response to a block selecting signal generated to select the corresponding memory cell array block and a control signal to control the corresponding partial block;
   an odd-numbered partial block control signal generating means for generating a control signal when a first selecting signal to select the odd-numbered corresponding partial block or a second selecting signal to select the partial block previous to the corresponding partial block is input in case that the odd-numbered sub word lines of the odd-numbered partial block are selected, and when the first selecting signal or a third selecting signal to select the partial block next to the corresponding partial block is input in case that the even-numbered sub word lines are selected; and
   an even-numbered partial block control signal generating means for generating a control signal when a fourth selecting signal to select a corresponding even-numbered partial block or a fifth selecting signal to select the partial block next to the corresponding even-numbered partial block is input in case that the odd-numbered sub word lines of the even-numbered partial block are selected, and when the fourth selecting signal or a sixth selecting signal to select the partial block previous to the corresponding even-numbered partial block in case that the even-numbered sub word lines is selected.

10. The device of claim 9, wherein the odd-numbered partial block control signal generating means includes:
    a first AND circuit for ANDing an 1-bit row address having a first state to select the odd-numbered sub word lines and the second selecting signal;
    a second AND circuit for ANDing an 1-bit row address having a second state to select the even-numbered sub word lines and the third selecting signal; and
    an OR circuit for ORing the first selecting signal and output signals of the first and second AND circuits to generate the control signal.

11. The device of claim 9, wherein the even-numbered partial block control signal generating means includes:
    a third AND circuit for ANDing an 1-bit row address having a first state to select the odd-numbered sub word lines and the fifth selecting signal;
    a fourth AND circuit for ANDing an 1-bit row address having a second state to select the even-numbered sub word lines and the six selecting signal; and
    a second OR circuit for ORing the fourth selecting signal and output signals of the third and fourth AND circuits to generate the control signal.

12. The device of claim 9, wherein each of the plurality of the sense amplifier control means includes first and second sense amplifier control means,
    the first sense amplifier control means including a) a fifth AND circuit for ANDing a control signal to control a corresponding partial block arranged on a left side thereof and a corresponding sense amplifier enable signal; b) a first NMOS transistor for generating a ground voltage as the first sense amplifier control signal in response to an output signal of the fifth AND circuit; and c) a first PMOS transistor for generating a power voltage as the second sense amplifier control signal in response to an output signal of the fifth AND circuit,
    the second sense amplifier control means including d) a sixth AND circuit for ANDing a control signal to control the corresponding block arranged on a right side thereof and the corresponding sense amplifier enable signal; e) a second NMOS transistor for generating a ground voltage as the first sense amplifier control signal in response to an output signal of the sixth AND circuit; and f) a second PMOS transistor for generating a power voltage as the second sense amplifier control signal in response to an output signal of the sixth AND circuit.

13. The device of claim 9, wherein the control signal is transferred through the crossing point.

14. The device of claim 13, wherein the control signal is a signal generated by combining a control signal to control the corresponding partial block and a control signal to control the neighboring partial block.

15. A semiconductor memory device which includes
a memory cell array including
a) memory cell array blocks;
b) partial blocks of each of the memory cell array blocks;
c) global word lines arranged over the memory cell array blocks;
d) first sub word line drivers arranged on a left side of the odd-numbered partial blocks and connected to the odd-numbered sub word lines of the previous partial block and the odd-numbered partial blocks;
e) second sub word line drivers arranged on a left side of the even-numbered partial blocks and connected to the even-numbered sub word lines of the previous partial block and the even-numbered partial blocks;
f) first drivers arranged on either of upper and lower sides of the first sub word line drivers and receiving a first sub word line decoding signal;
g) second drivers arranged on either of upper and lower sides of the second sub word line drivers and receiving a second sub word line decoding signal;
h) bit line sense amplifiers arranged on upper and lower sides of each of the partial blocks; and
i) sensing enable control signal generating means arranged in turn on a region of left and right sides of the bit line sense amplifier except the first and second drivers;
a first row decoder for generating a signal applied to the drivers and applied to the sub word line drivers;
a second row decoder for generating a global word line selecting signal to select the global word line; and
a column decoder, the device comprising,
a control means receiving a row address to select the sub word line and selecting signals of a corresponding partial block, the previous partial block and a next partial block which are output signals of the column decoder, and generating selecting control signals to select the partial block to be activated among the plurality of the partial blocks,
wherein, among the pselecting control signals, a corresponding partial block selecting control signal and a neighboring partial block selecting control signal are input into the first and second drivers to activate the sub word lines together with the first and second sub word line decoding signals.

16. A method of selecting word lines of a semiconductor memory device including a memory cell array, the memory cell array including a plurality of partial blocks, a plurality of global word lines, and odd-numbered and even-numbered sub word lines corresponding to each of the plurality of global word lines, the method comprising:
selecting simultaneously the odd-numbered sub word lines of the neighboring partial block previous to the odd-numbered partial block when plural-bit row and column addresses are simultaneously input and the odd-numbered sub word lines of the odd-numbered partial blocks among the plurality of the partial blocks are selected, and selecting simultaneously the even-numbered sub word lines of the neighboring partial block next to the odd-numbered partial block when the even-numbered sub word lines are selected; and
selecting simultaneously the odd-numbered sub word lines of the neighboring partial block next to the even-numbered partial block when the odd-numbered sub word lines of the even-numbered partial blocks among the plurality of the partial blocks are selected, and selecting simultaneously the even-numbered sub word lines of the neighboring partial block previous to the even-numbered partial block when the even-numbered sub word lines are selected.

17. The method of claim 16, further comprising,
generating odd-numbered partial block control signals in response to one of first to third selecting signals, the first selecting signal for selecting the corresponding odd-numbered partial block, the second selecting signal for selecting an 1-bit row address having a first state to designate the odd-numbered sub word lines and the neighboring partial block previous to the corresponding odd-numbered partial block, the third selecting signal for selecting an 1-bit row address having a second state to designate the odd-numbered sub word lines and the neighboring partial block next to the corresponding odd-numbered partial block;
generating a first decoding signal selecting the sub word lines in response to the odd-numbered partial block control signal and an even-numbered partial block control signal neighboring on the odd-numbered partial block control signal; and
selecting the corresponding sub word line by combining each of second decoding signals for selecting the global word lines and the first decoding signals.

18. The method of claim 16, further comprising,
generating even-numbered partial block control signals in response to one of fourth to sixth selecting signals, the fourth selecting signal for selecting the corresponding even-numbered partial block, the fifth selecting signal for selecting a row address having a first state the neighboring partial block next to the corresponding even-numbered partial block, the sixth selecting signal for selecting a row address having a second state and the neighboring partial block previous to the corresponding even-numbered partial block;
generating a first decoding signal selecting the sub word lines in response to the even-numbered partial block control signal and an odd-numbered partial block control signal neighboring on the even-numbered partial block control signal; and
selecting the corresponding sub word line by combining each of second decoding signals for selecting the global word lines and the first decoding signals.

19. A method of selecting word lines of a semiconductor memory device including a plurality of memory cell array blocks, each of the memory cell array blocks including a plurality of partial blocks, a plurality of global word lines, and a predetermined number of sub word lines corresponding to each of the plurality of the global word lines, the method comprising:
generating a global word line selecting signal for selecting the global word line by decoding a plural-bit first row address;

generating a sub word line selecting signal for selecting the sub word line by decoding a plurali-bit second row address;

selecting the partial block having the sub word lines to be activated by combining parts of the plural-bit second row address and a column address; and activating only the sub word lines of the partial block by combining the global word line, the partial block activation signal and the sub word line selecting signal.

20. A semiconductor memory device, comprising:

a plurality of memory cell array blocks each including a plurality of partial blocks in one of either a first or a second partial block group, a plurality of global word lines;

a plurality of sub word lines in one of either a first or second sub word line group, corresponding to each of the plurality of the global word lines, wherein:

in partial blocks of the first partial block group, sub word lines of the first sub word line group are connected to sub word lines of the first sub word line group of a previous block, and sub word lines of the second sub word line group are connected to sub word lines of the second sub word line group of a next partial block; and in partial blocks in the second partial block group, sub word lines of the first sub word line group are connected to sub word lines of the first sub word line group of the next partial block, and sub word lines of the second sub word line group are connect to sub word lines of the second sub word line group of a previous partial block; and a control means for selecting sub word lines of a corresponding partial block and sub word lines of a neighboring partial block connected to the sub word lines of the corresponding partial block when the corresponding partial block is selected in response to externally applied row and column address.

21. A semiconductor memory device, comprising:

a plurality of memory cell array blocks each including a plurality of partial blocks of either a first or second group, a plurality of global word lines, and sub word lines of either a first or second group corresponding to each of the plurality of the global word lines, the sub word lines of the first group of each of partial blocks of a first group among the plurality of the partial blocks, respectively, connected to the sub word lines of the first group of each of the previous neighboring partial blocks, the sub word lines of a second group of each of the odd-numbered partial blocks among the plurality of the partial blocks, respectively, connected to the sub word lines of the second group of each of the next neighboring partial blocks, the sub word lines of the first group of each of partial blocks of the second group among the plurality of the partial blocks, respectively, connected to the sub word lines of the first group of each of the next neighboring partial blocks, the sub word lines of the second group of each of the partial blocks of the second group among the plurality of the partial blocks, respectively, connected to the sub word lines of the first group of each of the previous neighboring partial blocks; and a plurality of sub word line drivers each including alternatively a first group sub word line driver and a second group sub word line driver between each of the plurality of the partial blocks, the sub word line driver of the first group for outputting first signals of the first group to the sub word lines of the first group in response to a first row decoding signal transferred to the global word line, the sub word line driver of the second group for first control signals of the second group to the sub word lines of the second group in response to the first row decoding signal.

* * * * *

UNITED STATES PATENT AND TRADEMARK OFFICE
CERTIFICATE OF CORRECTION

PATENT NO. : 6,747,908 B2
DATED : June 8, 2004
INVENTOR(S) : Lee et al.

It is certified that error appears in the above-identified patent and that said Letters Patent is hereby corrected as shown below:

Column 6,
Line 13, "signals YBL1 to YB14 and" should read -- signals YBL1 to YBL4 and --.
Line 37, "lines NWE1 to ¶" should read -- lines NWE1 to NWEj. ¶ --.

Signed and Sealed this

Twelfth Day of July, 2005

JON W. DUDAS
*Director of the United States Patent and Trademark Office*